(12) United States Patent
Lewis et al.

(10) Patent No.: US 7,592,702 B2
(45) Date of Patent: Sep. 22, 2009

(54) VIA HEAT SINK MATERIAL

(75) Inventors: J. Shelton Lewis, Hillsboro, OR (US);
Shawn Lloyd, Tigard, OR (US);
Michael Kochanowski, Portland, OR
(US); John Oldendorf, Portland, OR
(US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 11/461,211

(22) Filed: Jul. 31, 2006

(65) Prior Publication Data
US 2008/0023840 A1    Jan. 31, 2008

(51) Int. Cl.
*H01L 23/48* (2006.01)

(52) U.S. Cl. .............. 257/773; 257/723; 257/724; 257/731; 257/734; 257/698; 257/778; 257/E23.051; 257/E23.067; 257/E23.069

(58) Field of Classification Search .......... 257/778, 257/783, 723, 698, 697, 276, 625, 675, 706, 257/707, 712–722, 796, E33.075, E31.131, 257/E23.051, E23.08–E23.113, 773, 777–779, 257/E23.001–E23.194; 438/106–110
See application file for complete search history.

(56) References Cited

U.S. PATENT DOCUMENTS

| | | | |
|---|---|---|---|
| 5,218,234 A | 6/1993 | Thompson et al. | |
| 5,438,478 A | 8/1995 | Kondo et al. | |
| 5,785,233 A | 7/1998 | Nutter et al. | |
| 6,074,897 A | 6/2000 | Degani et al. | |
| 6,214,635 B1 | 4/2001 | Akram et al. | |
| 6,453,537 B1 | 9/2002 | Heim et al. | |
| 6,462,285 B2 | 10/2002 | Enroth et al. | |
| 6,469,393 B2 * | 10/2002 | Oya ....................... | 257/779 |
| 6,726,087 B2 | 4/2004 | Diehm et al. | |
| 6,815,817 B2 | 11/2004 | Akram et al. | |

* cited by examiner

*Primary Examiner*—Jasmine J Clark
(74) *Attorney, Agent, or Firm*—Blakely, Sokoloff, Taylor & Zafman LLP

(57) ABSTRACT

The invention provides thermally conductive material so that less heat traveling from one side of a layer will reach connection material on another side of a layer. Rather, some of the heat will be conducted away by the thermally conductive material and dissipated.

13 Claims, 5 Drawing Sheets

VIA HEAT SINK MATERIAL

CROSS-REFERENCED TO RELATED APPLICATION

This application claims benefit of U.S. patent application Ser. No. 10/717,348, filed Nov. 18, 2003.

BACKGROUND

Background of the Invention

In assembling components to a printed circuit board ("PCB") such as a motherboard, surface mount components, such as ball grid array ("BGA") components, are reflow soldered to the top side of the PCB. Other components, such as through hole components, are then soldered to the PCB by a wave solder process. This wave solder process heats the bottom side of the PCB, since hot solder contacts the bottom of the PCB.

This heat travels from the bottom side of the PCB to the top side of the PCB through via holes in the PCB. Enough heat may reach the top side of the PCB to melt solder balls in the BGA array and cause a failure of the electrical connection between the BGA component and the PCB.

DETAILED DESCRIPTION

Figure 1:
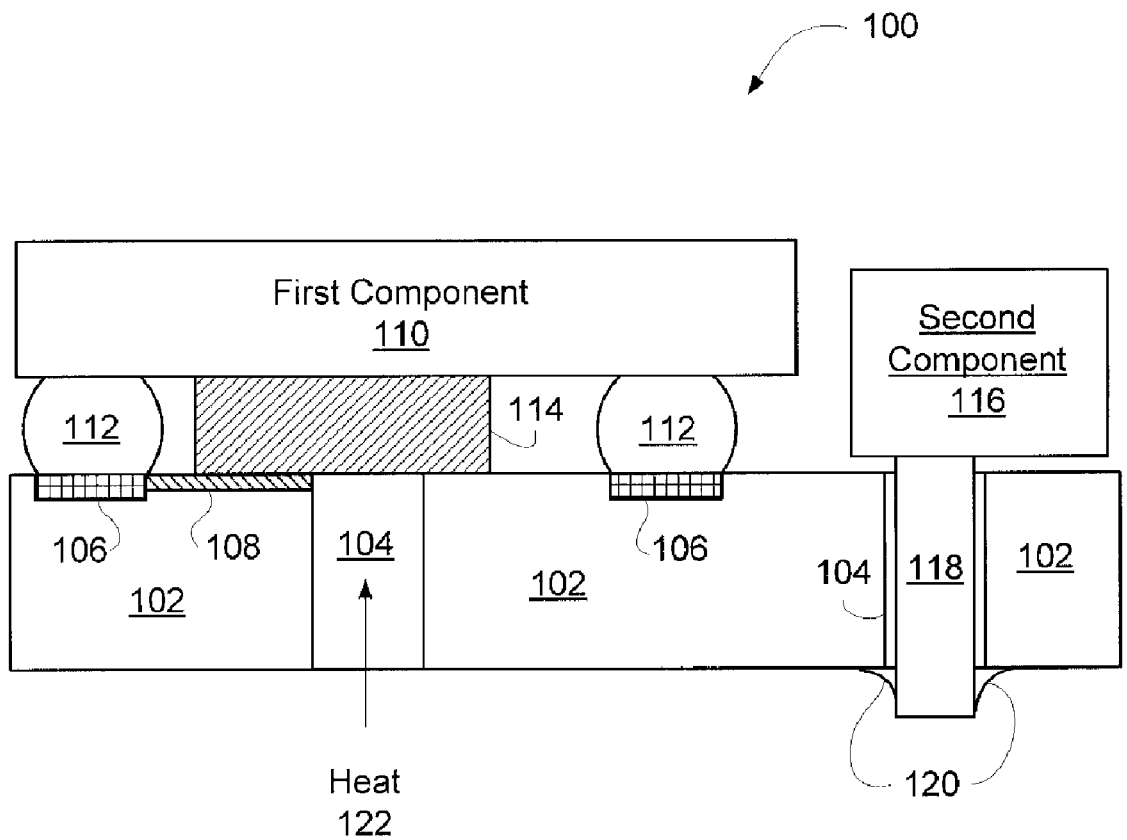
FIG. 1 is a side cross sectional view of a circuit board assembly according to one embodiment of the present invention.

FIG. 1 is a side cross sectional view of a circuit board assembly 100 according to one embodiment of the present invention. The circuit board assembly 100 may include a layer 102 to which components may be attached. The layer 102 may be a structural layer or any other layer or multiple layers to which components may be attached. In an embodiment, the layer 102 may be a printed circuit board ("PCB"), which may include several layers of fiberglass and conductive materials; the multiple layers that make up the PCB may be considered the layer 102.

The layer 102 may have one or more vias 104. These vias 104 may extend between the top and bottom surfaces of the layer 102, or may only extend partly through the layer 102. One or more of the vias 104 may be coated with a conductive material, such as copper or aluminum. The layer 102 may include or be connected to one or more connection pads 106. These connection pads 106 may provide an area for coupling an electronic component to the layer 102. The connection pads 106 may be made from a conductive material such as copper or aluminum, to allow electrical connection to such an electronic component. The connection pads 106 may be embedded in the layer 102, as illustrated in the embodiment in FIG. 1, or may extend above the top surface of the layer 102. In an embodiment, the connection pads 106 may be ball grid array ("BGA") pads, suitable for connecting to solder balls of a BGA component. The layer 102 may also include or be connected to one or more traces 108 that may connect the via 104 to the connection pad 106. The traces 108 may be made from a conductive material such as copper or aluminum and may be embedded in the layer 102, as illustrated in the embodiment in FIG. 1, or may extend above the top surface of the layer 102. In an embodiment, rather than separate traces 108 and connection pads 106, there may be a single conductive structure that functions as both a connection pad 106 and trace 108.

A first component 110 may be connected to the layer 102. The first component 110 may be a microprocessor die, a socket, a capacitor, a resistor, a transistor, or any other component or part connected to the layer 102. In an embodiment, the first component 110 may be a BGA component that is connected to the layer 102 by multiple solder balls 112, as illustrated in FIG. 1. The solder balls 112 may be considered one embodiment of a connection material that connects the first component 110 to the layer 102. The connection material may be heated above its melting point to connect the first component 110 to the layer 102. In an embodiment where the connection material is solder balls 112 and the first component 110 is a BGA component, a reflow soldering process may be used to heat the solder balls 112 above their melting point after positioning the first component 110 in place on the layer 102; when the solder balls 112 cool and resolidify, they may form both a structural and electrical connection between the first component 110 and the layer 102. Other connection materials, which may also be referred to as connective materials, besides solder may be used to connect non-BGA components in other embodiments.

Thermally conductive material 114 may be connected to the top surface of the layer 102, the via 104, the trace 108, and/or the connection pad 106. In an embodiment, the thermally conductive material 114 may be a thermal epoxy (an epoxy that is thermally curable), such as the epoxies "Hysol QMI 536HT" and "FP4650" sold by the Henkel Loctite Corporation of Rocky Hill, Conn. Other thermally conductive materials 114 may also be used. In some embodiments, the thermally conductive material 114 may be chosen to have a high thermal conductivity, such as greater than about 0.7 W/m K° in an embodiment, or about 0.9 W/m K° or greater in another embodiment. In the embodiment illustrated in FIG. 1, the thermally conductive material 114 extends from the layer 102 to the first component 110. In other embodiments, the thermally conductive material 114 may not extend all the way from the layer 102 to the first component 110, leaving space between the top of the thermally conductive material 114 and the bottom of the first component 110. As illustrated in the embodiment of FIG. 1, the thermally conductive material 114 is located completely between the layer 102 and the first component. In other embodiments, the thermally conductive material 114 may extend beyond the first component 110, or may be located on an area of the layer 102 that is not overlapped by the first component 110. Similarly, in various embodiments the thermally conductive material 114 may or may not be adjacent to the via 104.

A second component 116 may be connected to the layer 102. In an embodiment, the second component 116 may be a through hole component, with a connector 118 that extends from the second component 116 on the top of the layer 102 through a via 104 to the bottom of the layer 102. Solder 120, or another connection material, may couple the connector 118 of the second component 116 to the bottom of the layer 102. In an embodiment, solder 120 may be applied to couple the second component 116 to the layer 102 by a wave solder process. In such a wave solder process, the temperature of the solder 120 may be raised higher or as high as temperature of melting point of solder balls 112. In other embodiments, the second component 116 may be another type of component attached to the layer 102 by another connection material. In still other embodiments, a second component 116 may not be connected to the layer 102, but a different process may apply heat to the bottom of the layer 102 or to another part of the assembly 100. This heat may have a temperature that exceeds the melting point of the solder balls 112 that connect the first component 110 to the layer 102, or may exceed the melting point of another connection material used to connect a first component 110 to the layer 102.

Heat 122 from the bottom of the layer 102 may travel to the top of the layer 102. This heat 122 may originate from the heat of the molten solder 120 or from a preheat process in a wave solder process used to attach a second component 116 to the layer 102 as the hot solder contacts the bottom of the layer 102, or from another process as discussed above. The heat 122 may travel up one or more vias 104 from the bottom to the top of the layer 102 in an embodiment. For example, heat 122 may be carried convectively by air traveling up the via 104, heat 122 may be conducted through metallic walls of the via 104, or heat 122 may travel in other ways.

The thermally conductive material 114 prevents some heat 122 from reaching the solder balls 112 or other connection materials that would otherwise travel along the trace 108 to the connection pad 106 from the via 104. The thermally conductive material 114 connected to some area of the heat's 122 path from the bottom of the layer 102 to the connection pad 106 allows some of the heat 122 to enter the thermally conductive material 114 instead of traveling to the connection pad 106 and the solder balls 112. The thermally conductive material 114 may absorb the heat 122 and keep it from reaching the solder balls 112 of the first component 110. The thermally conductive material 114 may act as a thermal mass to receive some of the heat 122 and prevent that heat from reaching the solder balls 112 or other connection materials. The thermally conductive material 114 may prevent enough heat from reaching the solder balls 112 or other connection materials so that they do not melt as they might if some heat weren't absorbed by the thermally conductive material 114. In some embodiments where the second component 116 is attached by a wave solder process, the presence of the thermally conductive material 114 and its ability to prevent heat from reaching the solder balls 112 causes the maximum temperature caused by the wave solder process at the solder balls 112 to be about 10 Celsius degrees cooler than it would be without the thermally conductive material 114. In another embodiment the presence of the thermally conductive material 114 causes the maximum temperature to be about 15 Celsius degrees cooler. In one embodiment, the layer 102 may be preheated to approximately 100 to 110 degrees Celsius, and the second component 116 attached by a wave solder process where the layer 102 may be exposed to molten solder at a temperature of about 240 degrees Celsius for about 1.4 to 3 seconds. In such embodiment, the presence of the thermally conductive material 114 may cause the maximum temperature at the solder balls 112 to be about 10 to 15 Celsius degrees cooler than it would be without the thermally conductive material 114. This temperature reduction may result in preventing the solder balls 112 or other connection materials from melting.

Figure 2:
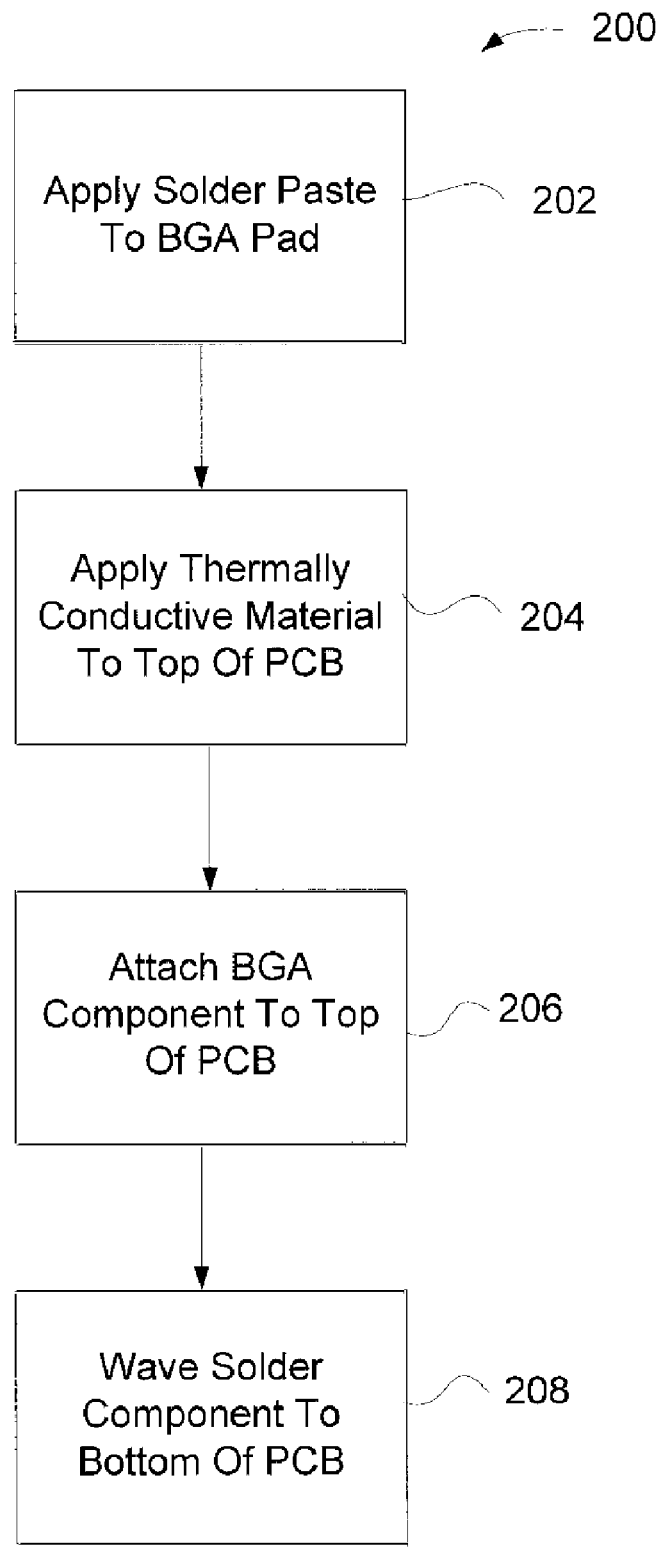
FIG. 2 is a flow chart that illustrates how the thermally conductive material may be applied to the layer according to one embodiment of the present invention.

FIG. 2 is a flow chart 200 that illustrates how the thermally conductive material 114 may be applied to the layer 102 according to one embodiment of the present invention. In the described embodiment, the layer 102 is a PCB, the first component 110 is a BGA component attached to connection pads 106 that are BGA pads on the top of the PCB, and the second component 116 is a through hole component that is wave soldered to the bottom of the PCB, although other embodiments may have other layers 102 and components. Solder paste may be applied 202 to the BGA pad.

Figure 3:
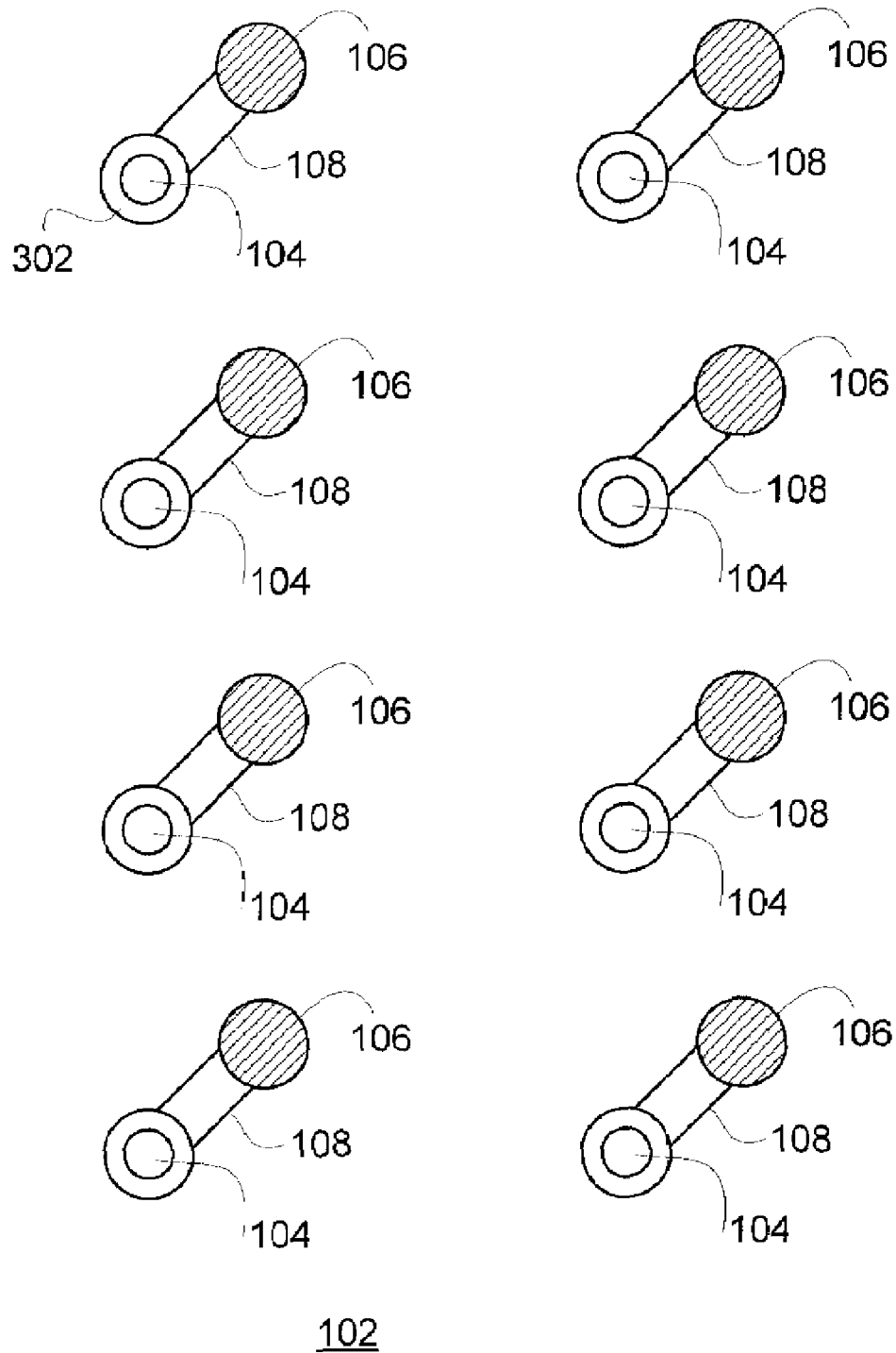
FIG. 3 is a top view that illustrates one embodiment of a layer prior to application of thermally conductive material.

FIG. 3 is a top view that illustrates one embodiment of a layer 102 prior to application of thermally conductive material 114. The layer 102 may include multiple vias 104 through the layer 102, multiple connection pads 106, and multiple traces 108 that connect the vias 104 to the connection pads 106. As discussed above, the vias 104 may have a conductive coating. Further, there may be conductive material 302 in an area around the via 104 holes. Since thermally conductive material 114 will be applied, the distance along the trace 108 from the via 104 to the connection pad 106 may be shorter than in an apparatus without thermally conductive material 114. For example, in some embodiments, the distance along the trace 108 from an uncapped via 104 to the connection pad 106 may be shorter than about 0.037.

Figure 4:
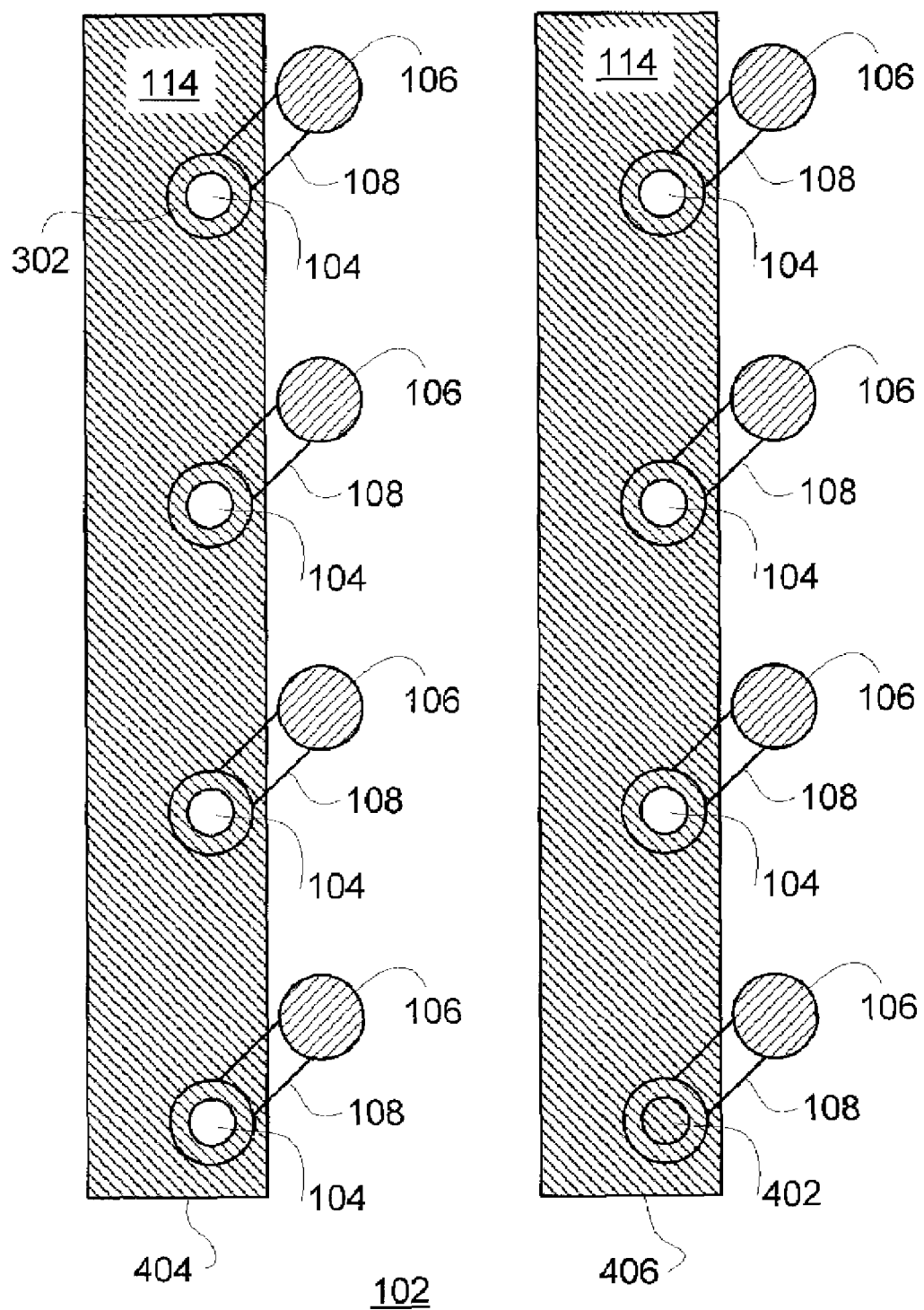
FIG. 4 is a top view that illustrates the layer of FIG. 3 after application of thermally conductive material.

Returning to FIG. 2, thermally conductive material 114 may be applied 204 to the top of the PCB layer 102. The thermally conductive material 114 may be applied manually with a syringe, automatically through a dispense machine such as an Asymtek, through use of a stencil in a screen print process, or through other methods. FIG. 4 is a top view that illustrates the layer 102 of FIG. 3 after application of thermally conductive material 114 according to one embodiment. There are two areas 404, 406 of thermally conductive material 114 applied to the embodiment of the layer 102 illustrated in FIG. 4. Each area 404, 406 is rectangular in shape and contacts the vias 104, the conductive material 302 around vias 104, and the traces 108. In other embodiments, the thermally conductive material 114 may be applied to result in fewer or more distinct areas 404, 406. Additionally, the thermally conductive material 114 may be applied in different shapes than rectangular. For example, the thermally conductive material 114 may be applied in a zig-zag shaped area, in a curved shape area, or in an arbitrarily shaped area. In an embodiment, the thermally conductive material 114 is applied to maximize its surface area touching the layer 102 to maximize its surface area touching highly thermally conductive portions, such as metal vias 104 and traces 108, and is placed to avoid disrupting nearby solder joints. The thermally conductive material 114 may also be applied to maximize its total volume on the board. Other embodiments may not contact all of the vias 104, the conductive material 302 around vias 104, and the traces 108, or may contact other areas to prevent heat from reaching the connection material such as a solder ball 112 that is coupled to the connection pads 106. In some embodiments, some or all of the via 104 holes may be covered or plugged by areas of the thermally conductive material 114, such as area 402. In other embodiments, some or all of the via 104 holes may left uncovered by the thermally conductive material 114.

Returning again to FIG. 2, a BGA component, such as the first component 110, may be attached 206 to the connection pads 106 on top of the PCB layer 102. Heat may be used to melt the solder balls 112 and connect them to the connection pads 106. This heat may also act to cure the thermally conductive material 114 and bond it to the layer 102 in some embodiments where the thermally conductive material 114 comprises a thermal epoxy. The second component 116 may then be wave soldered 208 to the bottom of the PCB layer 102. The heat from the wave soldering process, or from another process that applies heat to the layer 102 may be spread through the thermally conductive material 114 so that less heat reaches the connection pads 106 or the connection material such as the solder balls 112. In some embodiments, the thermally conductive material 114 need not be removed from the circuit board assembly 100. The assembly 100 may be completed and used by an end user with the thermally conductive material 114 remaining in place.

Figure 5:
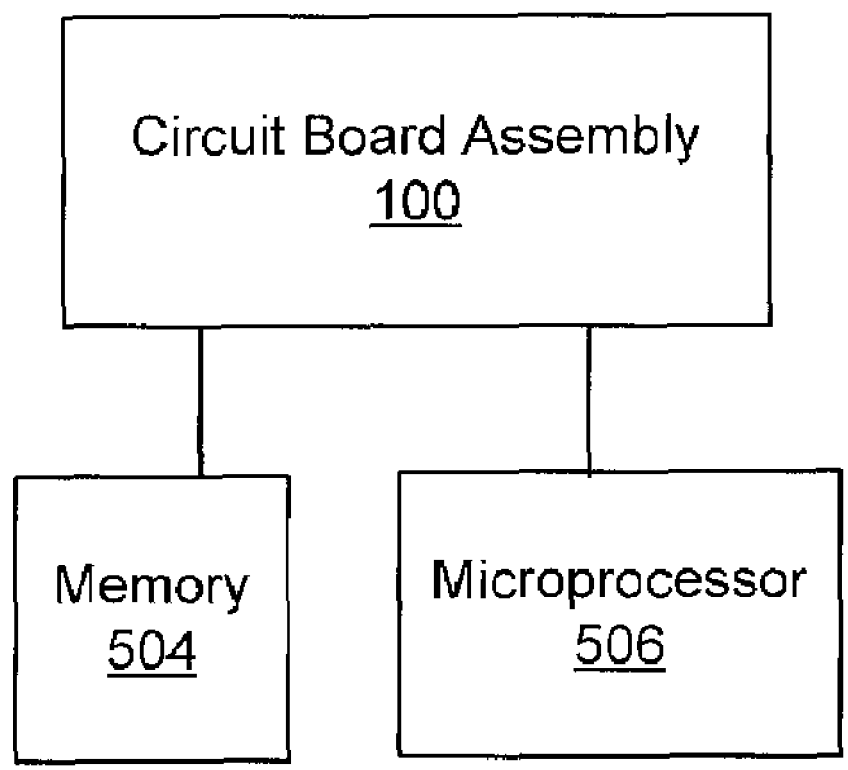
FIG. 5 is a schematic diagram of a computer system according to one embodiment of the present invention.

FIG. 5 is a schematic diagram of a computer system 502 according to one embodiment of the present invention. The computer system 502 may include the circuit board assembly 100 as described above. Additionally, the computer system 502 may include a memory 504 and/or a microprocessor 506, which may be connected to the circuit board assembly 100. The memory 504 and/or microprocessor 506 may be the first or second components 110, 116 as described above, or may be connected to the circuit board assembly 100 by different methods. The memory 504 may be any memory, such as random access memory, read only memory, or other memories. The microprocessor 506 may be any microprocessor. The computer system 502 may also include other components such as input/output units, mass storage units such as hard disk drives, or other components.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
   a structural layer having a first side with an electrically conductive connection pad, a via coated with an electrically conductive material extending from the first side to a second side, and an electrically conductive trace between the via and the connection pad;
   a first component connected to the connection pad;
   a second component connected to the second side of the structural layer; and
   a layer of thermally conductive material on at least part of the first side of the structural layer, wherein the thermally conductive material is in contact with at least one of the via or the conductive trace;
   the connection pad comprises a ball grid array pad;
   the first component is connected to the ball grid array pad with a solder ball; and
   the second component is connected to the second side of the structural layer with solder.

2. The device of claim 1, wherein the thermally conductive material comprises a thermal epoxy.

3. The device of claim 1, wherein the thermally conductive material is at least partially located between the first side of the structural layer and the first component.

4. The device of claim 3, wherein the thermally conductive material is in contact with both the first side of the structural layer and the first component.

5. The device of claim 4, wherein the structural layer comprises a printed circuit board, and the first component comprises a ball grid array device.

6. A device, comprising:
   a structural layer having a first side with an electrically conductive connection pad, a via coated with an electrically conductive material extending from the first side to a second side, and an electrically conductive trace between the via and the connection pad;
   a first component connected to the connection pad;
   a second component connected to the second side of the structural layer; and
   a layer of thermally conductive material on at least part of the first side of the structural layer, wherein the thermally conductive material is in contact with at least one of the via or the conductive trace, wherein the structural layer comprises a printed circuit board;
   a microprocessor connected to the printed circuit board; and
   memory connected to the printed circuit board.

7. A device, comprising:
   a structural layer having a first side with a plurality of electrically conductive connection pads, a plurality of vias each coated with an electrically conductive material extending from the first side to a second side, and a plurality of electrically conductive traces between vias and connection pads;
   a first component connected to at least one of the connection pads; and
   a layer of thermally conductive material on at least part of the first side of the structural layer, wherein the thermally conductive material is in contact with at least one of the vias or the conductive traces, wherein the structural layer of thermally conductive material is in contact with more than one of the vias.

8. The device of claim 7, wherein the layer of thermally conductive material is in contact with more than one of the conductive traces.

9. The device of claim 7, wherein the layer of thermally conductive material comprises a substantially non-electrically conductive material.

10. The device of claim 7, wherein the structural layer comprises a printed circuit board.

11. The device of claim 10, wherein the first component comprises a microprocessor.

12. A device, comprising:
    a structural layer having a first side and a second side;
    a plurality of vias each coated with an electrically conductive material extending from the first side to the second side of the layer;
    a first component electrically connected to at least one of the vias; and
    a layer of thermally conductive material that is substantially non-electrically conductive on at least part of the first side of the structural layer, wherein the first component is connected to the structural layer by solder, and at least some of the thermally conductive material immediately adjacent at least some of the vias.

13. The device of claim 12, wherein the layer of thermally conductive material covers less than all the first side of the layer.

* * * * *

UNITED STATES PATENT AND TRADEMARK OFFICE
CERTIFICATE OF CORRECTION

PATENT NO. : 7,592,702 B2  Page 1 of 1
APPLICATION NO. : 11/461211
DATED : September 22, 2009
INVENTOR(S) : Lewis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 201 days.

Signed and Sealed this

Twenty-first Day of September, 2010

David J. Kappos
*Director of the United States Patent and Trademark Office*